United States Patent [19]
Itou et al.

[11] Patent Number: 5,272,744
[45] Date of Patent: Dec. 21, 1993

[54] REFLECTION MASK

[75] Inventors: Masaaki Itou, Higashimurayama; Hiroaki Oizumi, Kokubunji; Shigeo Moriyama, Tama, all of Japan

[73] Assignee: Hitachi, Ltd., Tokyo, Japan

[21] Appl. No.: 933,300

[22] Filed: Aug. 21, 1992

[30] Foreign Application Priority Data

Aug. 22, 1991 [JP] Japan ................. 3-210614

[51] Int. Cl.⁵ .............................................. G21K 5/00
[52] U.S. Cl. ........................................ 378/35; 378/85; 430/5
[58] Field of Search ............... 378/35, 34, 84, 85; 430/5

[56] References Cited

U.S. PATENT DOCUMENTS

| | | | |
|---|---|---|---|
| 4,411,013 | 10/1983 | Takasu et al. | 378/35 |
| 4,891,830 | 1/1990 | Iwahashi | 378/35 |
| 5,052,033 | 9/1991 | Ikeda et al. | 378/35 |

FOREIGN PATENT DOCUMENTS 64-4021 9/1989 Japan.

*Primary Examiner*—Craig E. Church
*Attorney, Agent, or Firm*—Antonelli, Terry, Stout & Kraus

[57] ABSTRACT

In a reflection mask, there is formed at least one laminate structure comprising a high reflectivity portion, a middle portion and a high reflectivity portion. When there is a defect in the high reflectivity portion as the top layer, this high reflectivity portion and the underlying middle portion are removed in that defective position, thereby allowing the high reflectivity portion as the bottom layer to be exposed to repair the defect.

16 Claims, 6 Drawing Sheets

ABSORPTION AREA

REFLECTION MASK

BACKGROUND OF THE INVENTION

The present invention relates to a reflection mask for use in lithography process for semiconductor integrated circuits, particularly a reflection mask for X-rays.

In projection lithography of transferring circuit patterns written on a mask onto a wafer, a high resolving power is required. For improving the resolving power, it is necessary to either enlarge the numerical aperture (NA) of a projection optical system or shorten the exposure wavelength. At present, a resolving power of 0.3 $\mu m$ or so is attained using a lens system having an NA of about 0.5 and an ultraviolet radiation of 248 nm in wavelength. A larger value of NA is not practical because the depth of focus of the projection optical system will be deteriorated. Now, projection lithography using X-ray in place of ultraviolet radiation is considered to be promising. In the X-ray region, the refractive indices of every materials are extremely close to 1, so it is necessary to use a reflection optical system. In order to obtain a high reflectivity, the reflection optical system is constituted by multi-layer mirrors.

Masks used in X-ray projection lithography are classified into transmission type and reflection type. A transmission mask comprises a membrane of a light element material which transmits X-rays and patterns formed on the membrane using a heavy element material which absorbs X-rays. Since the X-ray absorption coefficient is extremely large also in light element materials, it is necessary that the membrane thickness be extremely small, not larger than 1 $\mu m$. Thus, the transmission type mask involves problems such as deterioration of the pattern positioning accuracy caused by stress and inconvenience of handling.

On the other hand, as described in Japanese Patent application Laid-Open No. 64-4021, there has been proposed a reflection mask comprising a multi-layer plane mirror and patterns formed thereon. FIG. 7 shows a construction of a conventional reflection mask. On a sufficiently thick substrate 1 there is formed a multi-layer 2 by laminating two kinds of materials with different refractive indices alternately in a large number of layers. This multi-layer exhibits a high reflectivity in the X-ray region. Part at normal incidence of the multi-layer is removed according to patterns, and the substrate serves as a non-reflective portion for X-rays. FIG. 8 shows another construction of a conventional reflection mask. A multi-layer 2 is formed on a substrate 1, for use as an X-ray reflecting portion. Part of the multi-layer is covered with an X-ray absorbing portion 8 according to patterns to form a non-reflective portion. The reflection mask, because of a thick substrate, is advantageous in that the distortion of pattern is difficult to occur and the handling of the mask is easy.

SUMMARY OF THE INVENTION

The multi-layer which constitutes the reflection mask referred to above is a laminate of several ten to several hundred thin films of several nm in 100 mm square or so. In order to attain a high reflectivity, it is necessary that the interface between the films be smooth. If even part of the reflective multi-layer portion cannot satisfy this condition, there will not be obtained a predetermined reflectivity. Consequently, the position thereof becomes a defect. Also when a dust particle is present in the interior or on the surface of the reflective multi-layer portion, that position becomes a defect. Such defects of the reflection mask result in increase of the lithography cost. In the conventional reflection mask, however, no consideration has been given to the repair of defects.

It is the object of the present invention to provide a reflection mask capable of removing and repairing defects easily.

According to the present invention, in order to achieve the above-mentioned object, a plurality of reflective layers are formed on a substrate, and out of those layers, a reflective layer having a defect is removed, thereby permitting the use of a lower layer. Preferably, there is formed a laminate structure comprising a reflective multi-layer, a middle layer for preventing the propagation of defect from the multi-layer, and a reflective multi-layer. A method for repairing a reflection mask according to the present invention includes a process of removing a defective portion of the upper, reflective multi-layer and a process of removing the middle layer portion which underlies the said defective portion.

The middle layer is sufficiently thick in comparison with the thin films which constitute the multi-layer. Therefore, even when the interfacial roughness of the lower reflective multi-layer is too large, it is possible to smooth the interface of the upper reflective multi-layer. Further, even in the event a dust particle is present in the lower reflective multi-layer, there will be no change in characteristics of the upper reflective multi-layer. In other words, there is no correlation between a defective position of the upper reflective multi-layer and that of the lower reflective multi-layer. In this case, the probability that both multi-layers will cause defects in the same position in a reflective plane is extremely low. Therefore, in the case where a defect is present in the upper reflective multi-layer, it is possible to repair the defect by exposing the lower reflective multi-layer. The present invention is also characterized in that a multi-layer is formed thick in advance and a defective portion of the multi-layer surface is removed to expose a new layer.

DETAILED DESCRIPTION OF THE PREFERRED EMBODIMENTS

Embodiments of the present invention will be described hereinunder with reference to the accompanying drawings.

Figure 1:
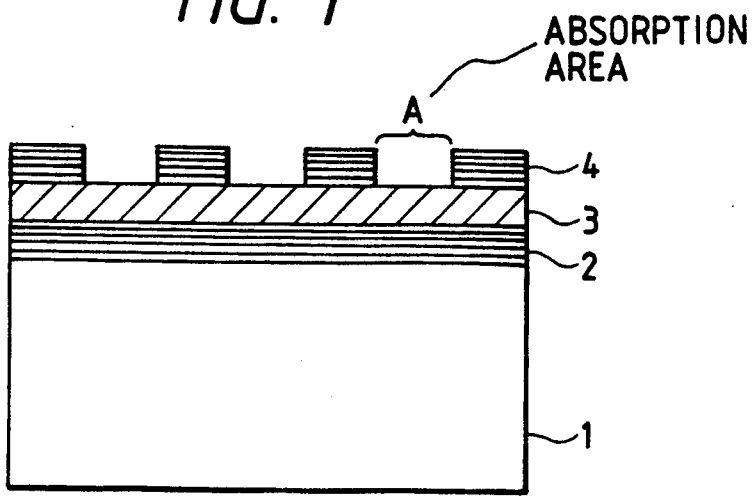
FIG. 1 is a view illustrating the construction of a mask according to a first embodiment of the present invention.

FIG. 1 shows a reflection mask according to a first embodiment of the present invention. A substrate 1 is made of SiC and has a sufficiently large thickness of 5 mm. A reflective multi-layer 2 is a laminate comprising 50 Mo films with a thickness of 2.5 nm and 50 Si films with a thickness of 4.2 nm, the films being laminated in an alternate manner. This reflective multi-layer exhibits a reflectivity of 60% for X-ray having a wavelength of 14 nm at an incidence angle of 5°. A middle layer is made of Au, has a thickness of 28 nm and exhibits a transmittance of 10% at 14 nm. A reflective multi-layer 4 is of the same structure in its depth direction as the reflective multi-layer 2 and a portion thereof is removed as an absorption area A according to patterns. X-ray which is incident on the middle layer 3 and is reflected by the lower reflective multi-layer 2 and radiated to the exterior of the mask thus reciprocates and so passes twice through the middle layer. Therefore, the contrast of the mask is sufficiently large. As to the material of the middle layer, which serves as an absorption layer in this embodiment, it is required to exhibit no diffusion to the multi-layers to prevent the decrease in reflectivity of the multi-layers and have a large X-ray absorption coefficient to obtain a high contrast. Other than Au, there also may be used W or Pt.

Figure 9:
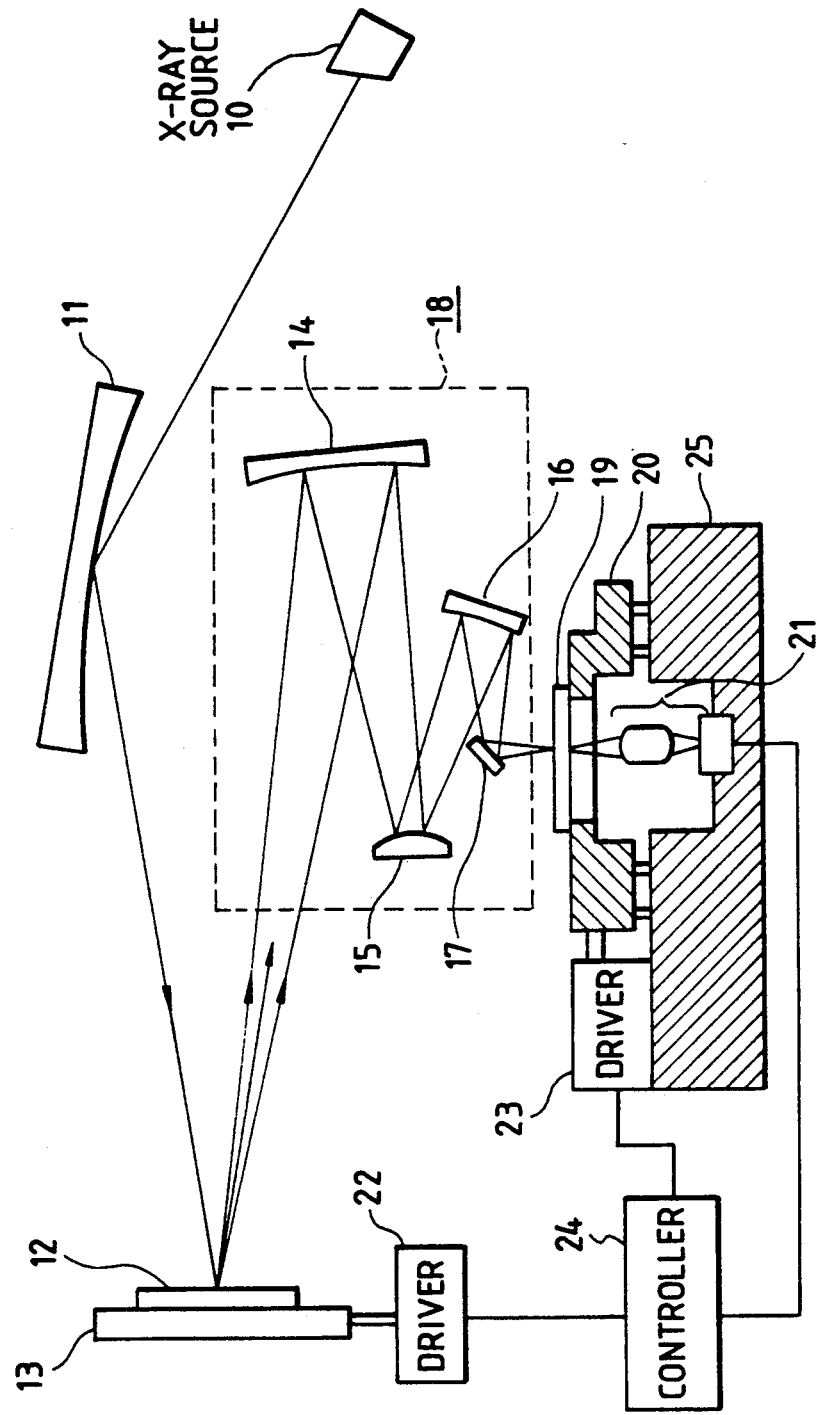
FIG. 9 is a view illustrating the construction of an X-ray projection aligner.

The above mask was loaded to an X-ray projection aligner shown in FIG. 9 and an imaging experiment was conducted. The mask, indicated at 12, and a wafer 19 are mounted on a mask stage 13 and a wafer stage 20, respectively. First, a position of the wafer with respect to the mask wafer is detected using an alignment device 21 and alignment is made through drivers 22 and 23 by means of a controller 24. Next, X-ray having a wavelength of 14 nm emitted from an X-ray source 10 is condensed by mirror 11 and then radiated to the mask at an incidence angle of 5°. A mask pattern is imaged onto the wafer by means of a projection optical system 18 comprising mirrors 14, 15, 16 and 17 with a magnification of 1/5. In this construction, a 0.1 μm pattern could be printed over a 20 mm square area on the wafer.

FIGS. 2(a) to 2(d) show an example of a method for producing the reflection mask of the first embodiment. In accordance with this embodiment, Mo/Si reflective multi-layer 2, Au middle layer 3 and Mo/Si reflective multi-layer 4 were formed successively in this order on a substrate 1, using a magnetron sputtering system, followed by coating of a resist film 5 to obtain the structure shown in FIG. 2(a).

Figure 2A:
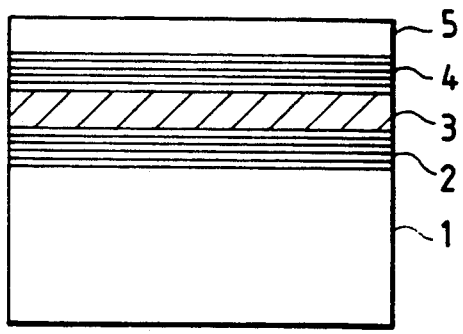
FIGS. 2(a) to 2(d) are views illustrating a method for producing the mask of the first embodiment.
Figure 2C:
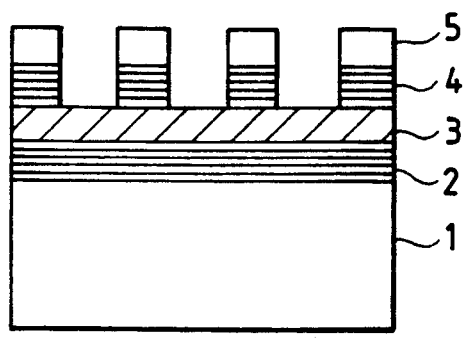
Figure 2B:
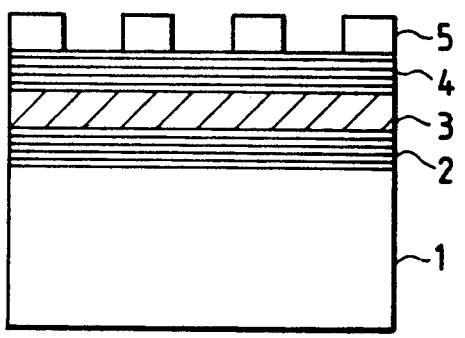
Figure 2D:
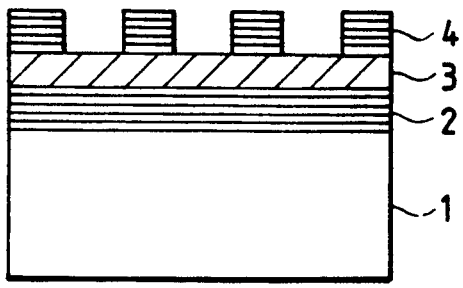

As to the resist film, a three-layer resist film is suitable for enhancing the etching resistance in the process which will be described later. Here there was used a three-layer resist film as a laminate comprising a hard-baked, 1.5 μm thick photoresist, 0.08 μm thick TiSi and 0.3 μm thick PMMA. Next, a pattern was formed on the resist film by writing with an electron beam to obtain the structure shown in FIG. 2(b). In the case where the circuit pattern size on the wafer is 0.1 μm and the magnification of the X-ray projection aligner is 1/5, the mask pattern size is 0.5 μm. A pattern having a size of this order can be written easily. The TiSi layer was removed by reactive ion etching using $CHF_3$ and the photoresist layer removed by reactive ion etching using $O_2$. Then, with the resist film 5 as a mask, the reflective multi-layer 4 was removed by plasma etching using $CF_4$—$O_2$ to obtain the structure of FIG. 2(c). Lastly, the resist film 5 was removed by $O_2$ plasma ashing to afford a reflection mask which is shown in FIG. 2(d).

Figure 3A:
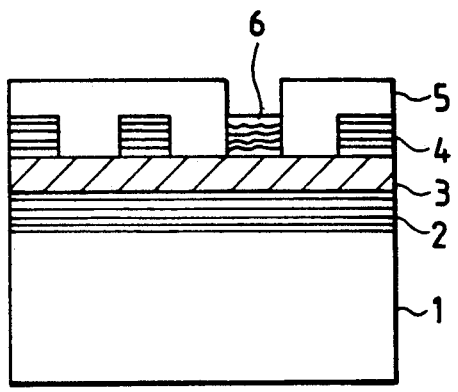
FIGS. 3 (a) to 3(d) are views illustrating a repairing method for a reflective portion in the mask of the first embodiment.
Figure 3B:
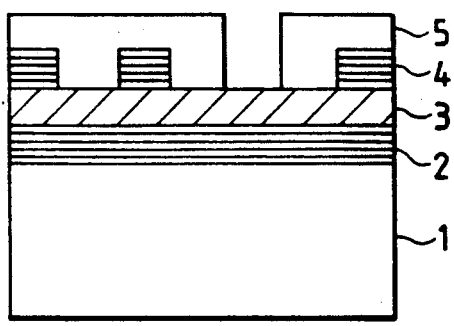
Figure 3C:
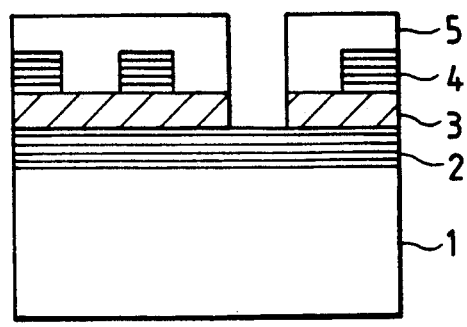
Figure 3D:
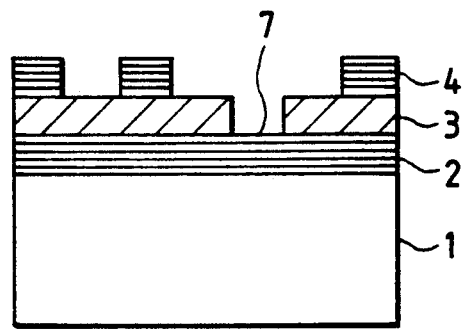

FIGS. 3(a) to 3(d) show an example of a defect repairing method for a reflective multi-layer, using the reflection mask of the first embodiment described above. First, the resist film 5 was coated over the mask surface and a defective portion 6 of the upper reflective multi-layer 4 was written with an electron beam to afford the structure of FIG. 3(a). There was used the same resist film and etching method as those used in the foregoing mask producing method. The remaining resist film serves as a mask in an etching process which will be described later. Next, the portion of the reflective multi-layer film 4 including the defective portion was removed by plasma etching using $CF_4$—$O_2$ to obtain the structure of FIG. 3(b). Thereafter, the corresponding portion of the middle layer 3 was removed by sputter etching using Ar to obtain the structure of FIG. 3(c). Lastly, the resist film 5 was removed by $O_2$ plasma etching to afford a defect-repaired reflection mask, as shown in FIG. 3(d). Since the sputter etching for the middle layer was performed at a low power, there was obtained the same reflectivity as that of the upper reflective multi-layer 4 without causing damage to an exposed portion 7 of the lower reflective multi-layer 4. The thickness of the middle layer is 28 nm as noted previously and it is an integer multiple of $\lambda/2 \times \cos\alpha$ wherein $\lambda$ represents an exposure wavelength and $\alpha$ represents an angle of incidence. Therefore, the phase of X-ray reflected by the upper reflective multi-layer and that of X-ray reflected by the lower reflective multi-layer are the same, exerting no influence on projected images. When the transfer of pattern was performed using the reflection mask after repair of the defect, there was obtained the same result as that obtained using a reflection mask free of defect.

Figure 4A:
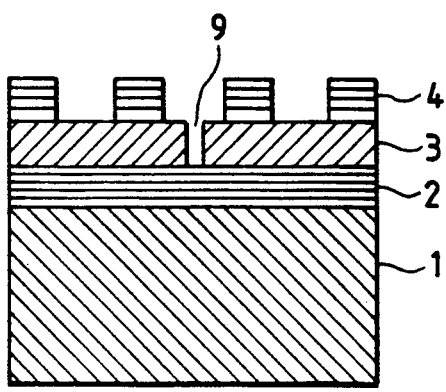
FIGS. 4(a) to 4(d) are views illustrating a repairing method for a middle portion in the mask of the first embodiment.
Figure 4C:
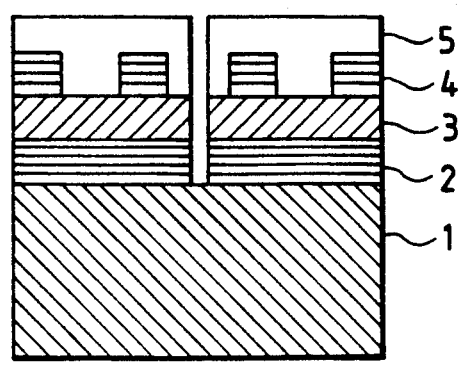
Figure 4B:
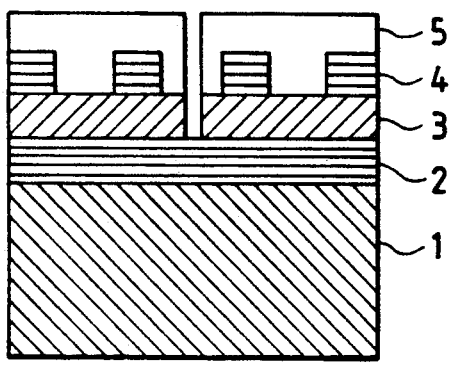
Figure 4D:
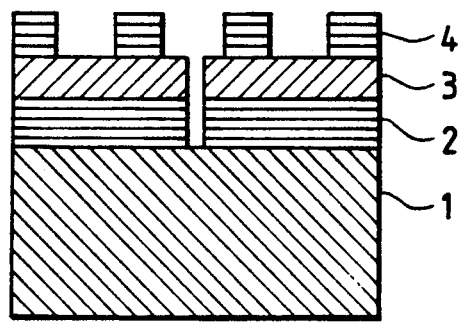

In the event a defect is present in the middle layer as shown in FIG. 4(a) and X-ray is reflected, the defect is repaired in the following manner. First, the resist film 5 was coated over the mask surface and defective portion 9 was written with an electron beam to afford the structure of FIG. 4(b). Next, the corresponding portion of the reflective multi-layer 2 under the defective portion was removed by plasma etching using $CF_4$—$O_2$ to afford the structure of FIG. 4(c). Lastly, the resist film 5 was removed by $O_2$ plasma ashing to obtain the structure of FIG. 4(d). As a result, the substrate 1 which does not reflect X-ray was exposed, whereby the defect of the middle layer could be repaired.

Figure 5:
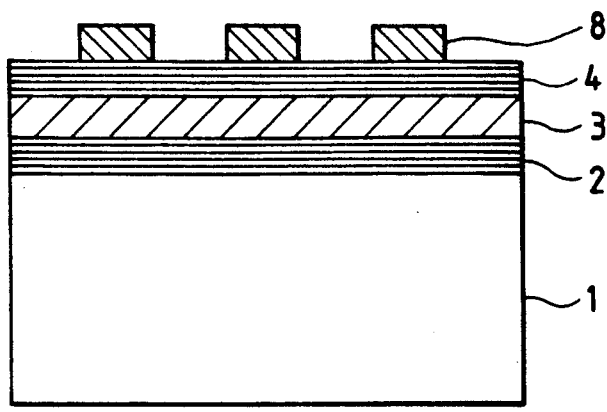
FIG. 5 is a view illustrating the construction of a mask according to a second embodiment of the present invention.
Figure 7:
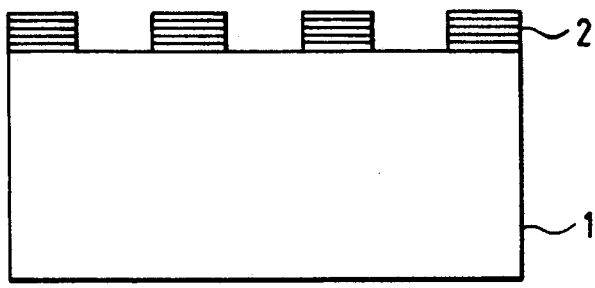
FIG. 7 is a view illustrating the construction of a conventional mask.
Figure 8:
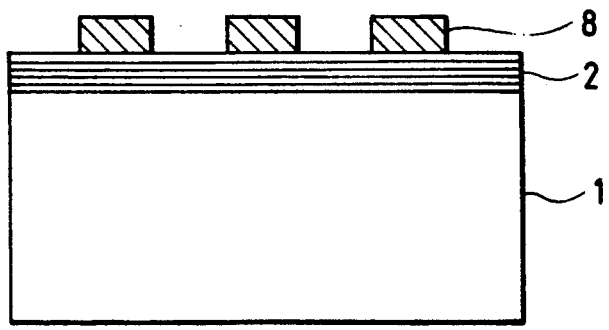
FIG. 8 is a view illustrating the construction of another conventional mask.

A second embodiment of the present invention will now be described with reference to FIG. 5. On a substrate 1 there are formed Mo/Si reflective multi-layer 2, Au middle layer 3 and Mo/Si reflective multi-layer 4 successively in this order. Further, an absorption layer 8 as the absorption area A is formed on the reflective multi-layer 4 according to a predetermined pattern. This construction is the same as that of the first embodiment described above. In this second embodiment, the upper reflective multi-layer film 4 is covered with the absorption layer as the absorption area A having a thickness of 100 nm in accordance with the pattern. This reflection mask can be produced in the same manner as in the production of the reflection mask of the first embodiment. In this reflection mask, moreover, the repair of defect in the reflective multi-layer 4 can be done in the same way as in the reflection mask of the first embodiment. If a defect is present in the absorption layer and so X-ray is reflected, the absorption layer portion at the defective position and the underlying portion of the upper reflective multi-layer are removed, whereby the corresponding portion of the middle layer not reflecting X-ray is exposed, thus permitting repair of the defective portion of the absorption layer.

Figure 6A:
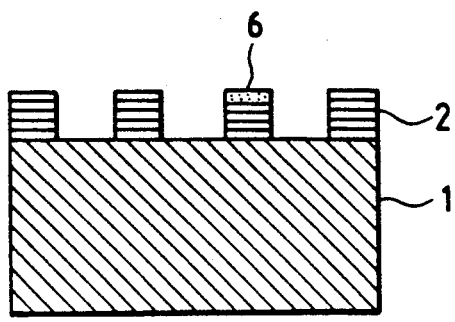
FIGS. 6(a) to 6(d) are views illustrating a mask repairing method according to the present invention.
Figure 6B:
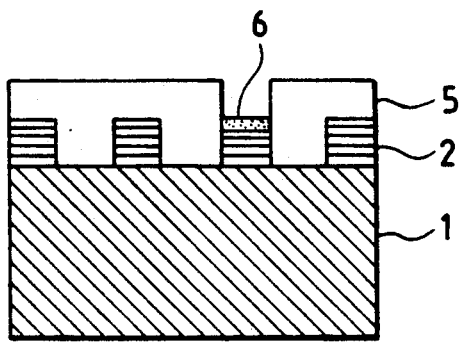
Figure 6C:
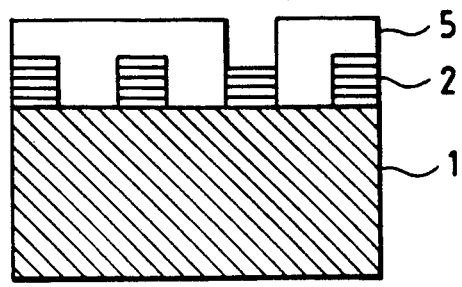
Figure 6D:
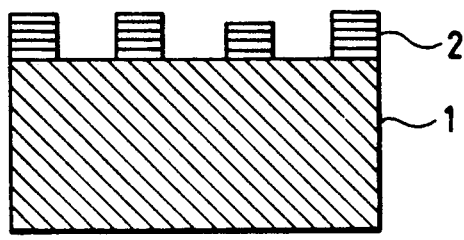

A mask repairing method according to a further embodiment of the present invention will now be described. FIG. 6(a) shows a reflection mask having a defect in the surface layer of a reflective multi-layer. On a substrate 1 is formed a reflective multi-layer 2, which is partially removed according to a predetermined pattern, and hence the corresponding portions of the substrate which is non-reflective are exposed. The reflective multi-layer 2 is a laminate comprising 60 Mo films with a thickness of 2.5 nm and 60 Si films having a thickness of 4.1 nm, the layers being laminated in an alternate manner. The multi-layer 2 is used at a wavelength of 14 nm and an incidence angle of 5°. A defective portion 6 of the surface layer of the multi-layer 2 is repaired in the following manner. First, a resist film 5 was coated over the mask surface and the defective portion was written with an electron beam to afford the structure of FIG. 6(b). Then, as shown in FIG. 6(c), 10 films of each of the thin Mo and Si were removed by plasma etching using $CF_4$—$O_2$, allowing the reflective multi-layer portion free of defect to be exposed. The multi-layer film thus exposed comprises 50 Mo films and 50 Si films. Lastly, resist film 5 is removed by $O_2$ plasma ashing to obtain the structure of FIG. 6(d). The thickness of the removed portion of the reflective multi-layer was 67 nm, corresponding substantially to an integer multiple of $\lambda/2 \times \cos\alpha$ wherein $\lambda$ represents an exposure wavelength and $\alpha$ represents an angle of incidence. Therefore, the phase of X-ray reflected by the reflective multi-layer free of defect and that of X-ray reflected by the defect-repaired reflective multi-layer are the same, exerting no influence on projected images. The reflectivity of the Mo/Si multi-layer increases with increase in the number of films, but takes a constant value of 60% if the number of layers exceeds 50. Therefore, the reflectivity of the reflective multi-layer free of defect and that of the defect-repaired reflective multi-layer are equal to each other. When the transfer of pattern was made using the reflection mask after the repair of defect, there was obtained the same result as that obtained using the defect-free reflection mask.

The mask structure is not limited to the above embodiments. By repeating two or more of the laminate structure comprising a reflective multi-layer, a middle layer and a reflective multi-layer, the probability of success in the repair of defect can be enhanced. The material of mask is not limited to the above embodiments, either. As to the material of substrate, a material which can easily afford a smooth surface, e.g. Si or fused quartz, is considered. As examples of materials employable as constituent materials of the multi-layer there are mentioned heavy element materials such as Mo, Ru, Rh, W, Re, Ni, Cr, and light element materials such as Be, B, C and Si. As the multi-layer forming method there may be adopted, for example, an ion beam sputtering method, as electron beam evaporation method, or a CVD method. Further, as the pattern forming method in the repair of defect, there may be adopted a focused ion beam writing method as well as an electron beam writing method.

The present invention is applicable not only to a reflection mask for the fabrication of semiconductor integrated circuits but also to a multi-layer optical element having patterns formed on its reflective surface. An example of such multi-layer optical element is a Fresnel zone plate.

According to the present invention, the repair of defect of a reflection mask can be done easily and thus the effect of reducing the lithography cost is outstanding.

In the drawings:

1 . . . substrate, 2 . . . multi-layer, 3 . . . middle layer, 4 . . . multi-layer, 5 . . . resist film, 6 . . . a defective portion of multi-layer, 7 . . . an exposed portion of multi-layer, 8 . . . absorption layer, 9 . . . a defective portion of middle layer, 10 . . . X-ray source, 11 . . . mirror, 12 . . . mask, 13 . . . mask stage, 14, 15, 16, 17 . . . mirrors, 18 . . . projection optical system, 19 . . . wafer, 20 . . . wafer stage, 21 . . . alignment device, 22, 23 . . . drivers, 24 . . . controller, 25 . . . base, A . . . absorption area

What is claimed is:

1. A reflection mask including:
   a substrate;
   a first reflective layer which reflects radiation;
   a second reflective layer formed between the first reflective layer and the substrate;
   a middle layer formed between the first and second reflective layers to prevent the propagation of defects of the reflective layers; and
   a radiation absorption area of a predetermined pattern formed in the first reflective layer.

2. A reflection mask according to claim 1, wherein said radiation absorption area formed in the first reflective layer is an area to which said middle layer is exposed.

3. A reflection mask according to claim 1, wherein said radiation absorption area is constituted by a radiation absorption layer formed on the first reflective layer.

4. A reflection mask according to one of claims 1 to 3, wherein said first and second reflective layers are each a multi-layer comprising molybdenum and silicon.

5. A reflection mask according to one of claims 1 to 3, wherein said middle layer is formed of Au.

6. A reflection mask according to one of claims 1 to 3, wherein said first and second reflective layers are each a multi-layer formed by a combination of a heavy element material selected from Mo, Ru, Rh, W, Re, Ni and Cr with a light element material selected from Be, B, C and Si.

7. A reflection mask according to claim 2, wherein said middle layer is now in reflectivity.

8. A reflection mask according to one of claims 1 to 3, wherein said first reflective layer is a multi-layer constituted by a laminate of thin films of at least two kinds of materials different in refractive index, said thin films being laminated in an alternate manner.

9. A reflection mask according to one of claims 1 to 3, wherein said substrate is formed of SiC.

10. A reflection mask according to claim 4, wherein said middle layer is formed of Au.

11. A reflection mask according to claim 4, wherein said first and second reflective layers are each a multi-layer formed by a combination of a heavy element material selected from Mo, Ru, Rh, W, Re, Ni and Cr with a light element material selected from Be, B, C and Si.

12. A reflection mask according to claim 4, wherein said first reflective layer is a multi-layer constituted by a laminate of thin films of at least two kinds of materials different in refractive index, said thin films being laminated in an alternate manner.

13. A reflection mask according to claim 4, wherein said substrate is formed of SiC.

14. A reflection mask according to claim 5, wherein said first and second reflective layers are each a multi-layer formed by a combination of a heavy element material selected from Mo, Ru, Rh, W, Re, Ni and Cr with a light element material selected from Be, B, C and Si.

15. A reflection mask according to claim 5, wherein said first reflective layer is a multi-layer constituted by a laminate of thin films of at least two kinds of materials different in refractive index, said thin films being laminated in an alternate manner.

16. A reflection mask according to claim 5, wherein said substrate is formed of SiC.

* * * * *